(12) United States Patent
Das et al.

(10) Patent No.: US 6,207,541 B1
(45) Date of Patent: Mar. 27, 2001

(54) METHOD EMPLOYING SILICON NITRIDE SPACERS FOR MAKING AN INTEGRATED CIRCUIT DEVICE

(75) Inventors: Siddhartha Das, Sunnyvale; Chunlin Liang, San Jose, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,549

(22) Filed: Dec. 16, 1999

Related U.S. Application Data

(62) Division of application No. 09/000,862, filed on Dec. 30, 1997, now Pat. No. 6,133,128.

(51) Int. Cl.[7] .............................................. H01L 21/3205
(52) U.S. Cl. ......................... 438/585; 438/591; 438/593; 438/949
(58) Field of Search .................................. 438/585, 591, 438/593, 949

(56) References Cited

U.S. PATENT DOCUMENTS

| | | | |
|---|---|---|---|
| 5,960,270 | * | 9/1999 | Misra et al. ........................... 438/197 |
| 6,022,815 | * | 2/2000 | Doyle et al. ........................... 438/947 |
| 6,107,140 | * | 8/2000 | Lee et al. .............................. 438/259 |
| 6,133,128 | * | 10/2000 | Das et al. .............................. 438/585 |

* cited by examiner

*Primary Examiner*—John F. Niebling
*Assistant Examiner*—Alexander G. Ghyka
(74) *Attorney, Agent, or Firm*—Blakely, Sokoloff, Taylor & Zafman LLP

(57) ABSTRACT

A process for patterning a gate of a semiconductor device is provided. A gate material layer is formed upon an oxide layer of a substrate. A photoresist layer is formed upon the gate material layer. A portion of the photoresist layer is photo oxidized. The portion defines a gate pattern. The portion of the photoresist layer is converted into a hard mask. A portion of the gate material layer is patterned with the hard mask. The portion of the gate material layer defines a gate.

6 Claims, 4 Drawing Sheets

193 NM RADIATION EXPOSURE

METHOD EMPLOYING SILICON NITRIDE SPACERS FOR MAKING AN INTEGRATED CIRCUIT DEVICE

This is a divisional of application Ser. No. 09/000,862, filed Dec. 30, 1997 now U.S. Pat. No. 6,133,128.

BACKGROUND OF THE INVENTION

1. Field of the Invention

The present invention generally relates to integrated electronic circuit fabrication More specifically, the present invention relates to a method for patterning a polysilicon gate layer.

2. Description of the Related Art

The semiconductor industry has seen the continuous development of manufacturing processes in the fabrication of devices and circuits in ever higher density, quantity, and reliability. Although integrated circuit chip size has grown as more and more devices are crowded into circuits, higher densities may not be possible without commensurate decrease in the size of the parts of individual devices of the integrated circuit, known as device feature size. This decrease has been brought about by improvements in the imaging process—photolithography—also known by such names as photomasking, optical lithography, and microlithography.

Photolithography is a patterning process that results in removal of selected portions of added surface layers. After removal, a pattern or image of the layer is left on the wafer surface. The material removed may be in the form of a trench or hole in the layer or just a remaining line or island of the material. It is this patterning process that creates the surface parts of the devices that make up a circuit.

It is important that the dimensions of a pattern created on a wafer surface be as close to the design requirements as possible. This goal is referred to as the resolution of the images on the wafer. Patterns created on a wafer's surface near or with the exact dimensions (feature size), required by the circuit design, are considered to have high resolution and dimensional control. Patterns created on the wafer surface away from the exact dimensions required by the circuit design are considered to have poor dimensional control. Patterns having poor dimensional control can cause changes in the electrical functioning of the device or circuit. Changes in the electrical functioning of the device or circuit lead to poor transistor performance in semiconductor integrated circuits.

Conventional photolithography processes utilize photoresists—light-sensitive layers formed upon substrate, that are typically exposed to high-intensity light through a mask. The exposed or unexposed photoresist is then dissolved with developers, leaving a pattern of photoresist which allows etching, subsequently performed, to take place in some areas while preventing it in others.

However, typically in the fabrication of transistor gates, conventional photolithography processes require the use of a bulk imaging photoresist. A bulk imaging photoresist is used to function as an effective barrier during an etching step of a patterning process. Therefore, in a conventional photolithography process, selection of the thickness of the photoresist layer may be problematic due to the competing interests that the photoresist layer be thin enough to prevent as much loss of resolution as possible during an exposure step and be thick enough to function as a reliable etch barrier during the etching process.

These criteria are especially critical for developing high performance integrated circuits where it is important to scale and control the physical gate dimension of MOSFETs to obtain reduced feature size, increased circuit density, and high speed. The current demands of decreased feature sizes, especially into deep-submicron range, and increased need for high resolution images have exceeded the capabilities of the conventional photoresist processes.

It is desirable to provide a process for patterning a gate of a transistor to obtain high image resolution but yet provide good photoresistance to etching. It is desirable that such process be easily integrated into a standard CMOS fabrication process.

SUMMARY OF THE INVENTION

The present invention provides a process for patterning a gate of a semiconductor device. A gate material layer is formed upon an oxide layer of a substrate. A photoresist layer is formed upon the gate material layer. A portion of the photoresist layer is photo-oxidized. The portion of the photoresist layer defines a gate pattern. The portion of the photoresist layer is converted into a hard mask. A portion of the gate material layer is patterned with the hard mask. The portion of the gate material layer defines a gate.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having an ordinary skill in the art will recognize that the invention can be practiced without these specific details. In some instances, depending upon the device being fabricated, well-known circuits, structures, techniques, processing steps used to fabricate the device according to the present invention have not been shown in detail to avoid unnecessarily obscuring the present invention.

Figure 1:
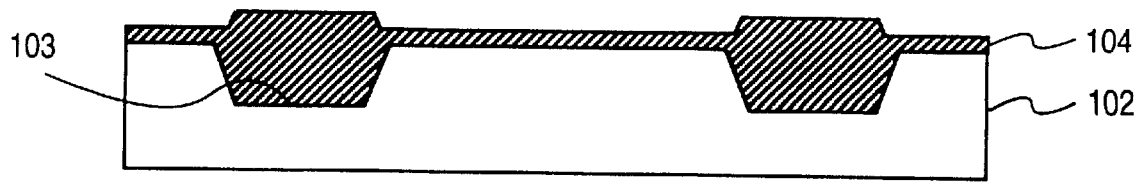
FIG. 1 illustrates a moss section of an integrated circuit structure where shallow trenches and an oxide layer are formed according to one embodiment of the method of the present invention.

FIG. 1 illustrates silicon substrate 102 having pockets or trenches 103 that etched in substrate 102 by way of shallow trench isolation (STI) processes. Silicon substrate 102 can be, by way of non-limiting example, a semiconductor wafer including device regions such as diffused junctions, other structures such as gates, local interconnects, metal layers, or other active or passive device structures or layers. STI processes are well known methods for isolating devices of the same type. The trenches 103 are etched either anisotropically by way of dry etch techniques or isotropically by way of wet techniques.

A dielectric layer, gate oxide layer 104, is grown on the surface of the silicon substitute 102 after trenches are etched and filled by one of the following methods: plasma-enhanced chemical vapor deposition (PECVD), thermal CVD (TCVD), atmospheric pressure CVD (APCVD), sub-atmospheric pressure CVD (SACVD), for example, utilizing TEOS (tetraethyl orthosilicate) and oxygen or TEOS and ozone chemistries. Dielectric layer 104 serves the purpose of insulating between any conductive structures which may be found in silicon substrate 102 and other conductive layers or patterns which are further formed on top of dielectric layer 104. Dielectric layer 104 typically has a thickness of less than 50 Angstroms. Dielectric layer 104 may be made of material such as, but not limited to: thermal silicon dioxide ($SiO_2$), silicon nitride ($Si_3N_4$); or silicon oxi-nitride ($SiO_xN_y$).

Figure 2:
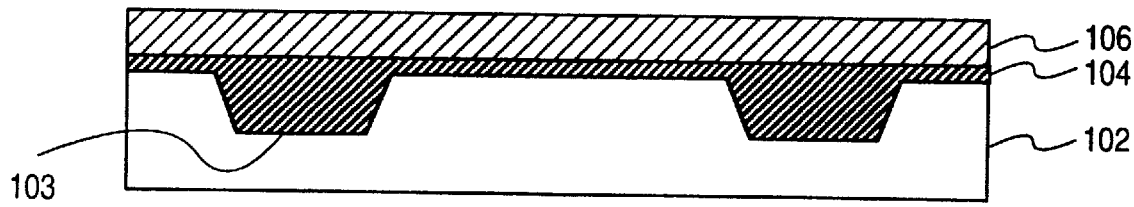
FIG. 2 illustrates a cross section of an integrated circuit structure where a polysilicon layer is deposited upon the oxide layer according to one embodiment of the method of the present invention.

FIG. 2 shows a layer of polysilicon 106 deposited onto gate oxide layer 104. The thickness of polysilicon layer 106 is scaled with the technology but typically is in the range of approximately 1,300–3,000 Angstroms. Deposited doped polysilicon is chosen as the standard gate electrode material for MOS transistors because of its better interface characteristics.

Conventional polysilicon deposition processes are well known in the art. Such deposition processes typically take place at temperatures in the range of 600 to 650° C. However, these deposition processes may take place at higher temperatures. Either 100 percent Silane or gas streams containing $N_2$ or $H_2$ may be used in the polysilicon deposition process.

Figure 3:
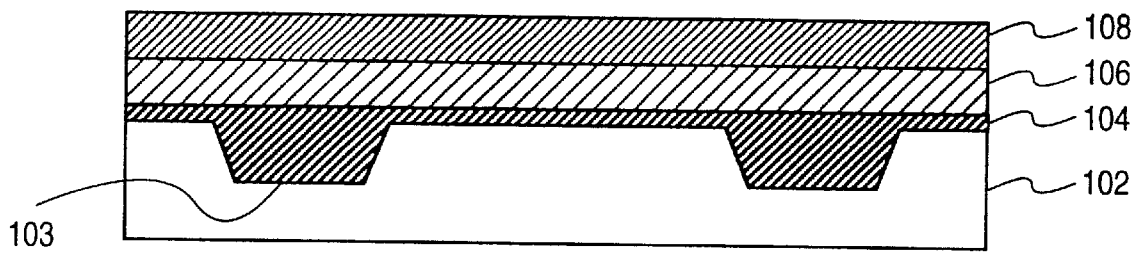
FIG. 3 illustrates a cross section of an integrated circuit structure where a plasma polymerized methyl silane (PPMS) layer is deposited upon the polysilicon layer according to one embodiment of the method of the present invention.

Following the deposition of polysilicon layer 106, a patterning layer such as photoresist layer 108 is formed upon the polysilicon layer as shown in FIG. 3. Photoresist layer 108 is made of a suitable photosensitive material. Photoresist layer 108 may be made from materials found in the organosilane group, for instance. In one embodiment of the present invention described herein, the photoresist material is made from thin plasma polymerized methyl silane (PPMS). PPMS is a good photoresist material to use for gate patterning because it exhibits excellent photosensitivity and efficient photo-oxidation when exposed to radiation. The thin PPMS photoresist layer 108 may have a photoresist thickness in the range of 1,000–2,000 Angstroms, depending on the selectivity of the pattern used and the thickness of polysilicon layer 106. PPMS photoresist layer 108 is deposited by a plasma enhanced chemical vapor deposition process which is well-known in the art.

Figure 4:
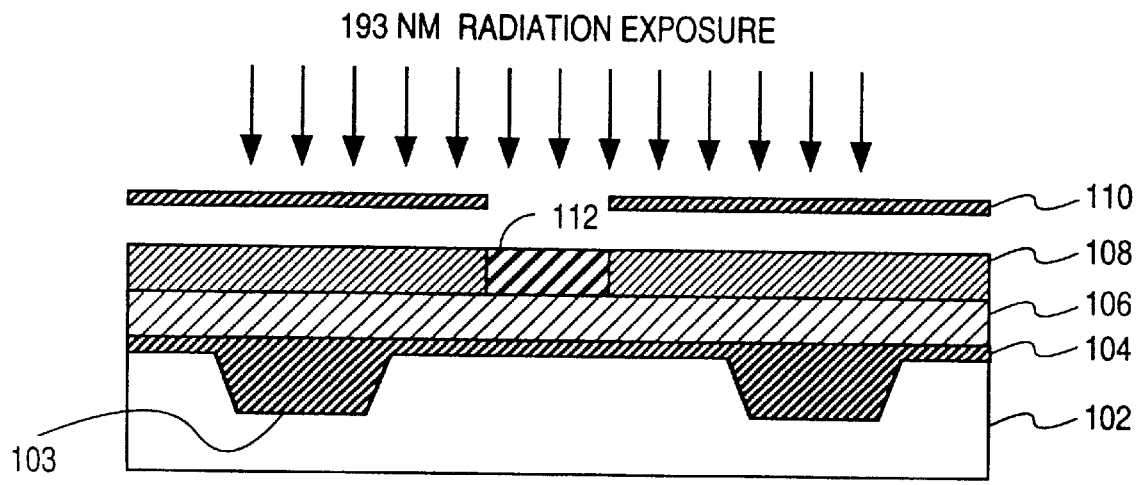
FIG. 4 illustrates a cross section of an integrated circuit structure where a portion of the PPMS layer is exposed to radiation and the PPMS portion is converted to plasma polymerized methyl silane oxide (PPMSO) according to one embodiment of the method of the present invention.

FIG. 4 illustrates a cross section of an integrated circuit structure where a portion 112 of the PPMS layer 108, defined by photoresist mask 110 is exposed to 193 nm radiation being converted to plasma polymerized methyl silane oxide (PPMSO). As a result of exposure to radiation portion 112 of PPMS photoresist layer 108 is photo-oxidized and converted to plasma polymerized methyl silane oxide (PPMSO).

Photoresist layer 108 is patterned by well known photolithography techniques, which include masking the layer of photoresist 108, exposing the masked layer of photoresist 108 to radiation, and then developing the portions not exposed to radiation. The radiation, or electromagnetic energy, comprises a number of different types of energy: extreme ultraviolet, E-beam, and X-rays. These forms of radiation are differentiated from each other by their wavelengths, with the shorter wavelength radiation having higher energies. Wavelength of the radiation typically used in photolithography are 436 nm, 365 nm, 248 nm, and 193 nm. In the embodiment of the present invention described herein, a shorter wavelength of 193 nm that has a higher energy is used to efficiently photo-oxidize PPMS thereby achieving a faithful reproduction of the prescribed image size. For further descriptions on PPMS based photolithographic processes for use in 193 nm lithography, see R. L. Kostelak, Application of plasma polymerized methylsilane photoresist for all-dry 193 nm deep UV processing, Journal of Photopolymer Science and Technology, Vol. 8, No. 4 (1995).

Figure 5:
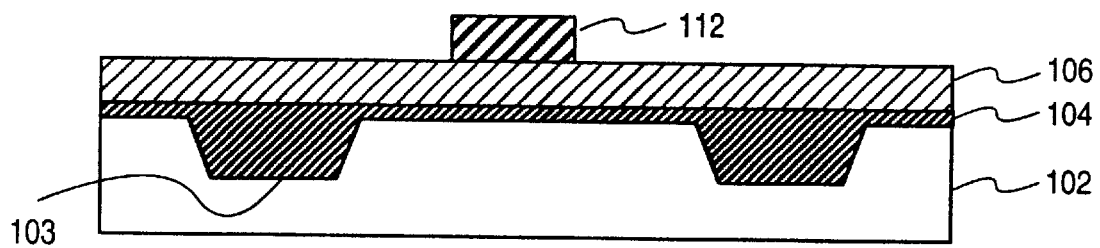
FIG. 5 illustrates a cross section of an integrated circuit structure where the unexposed PPMS layer is removed according to one embodiment of the method of the present invention.

FIG. 5 illustrates a cross section of substrate 102 with the remaining portion 112 of PPMSO after the unexposed PPMS layer has been removed through a plasma develop process. The plasma develop process may be performed using conventional plasma etching tools. Hydrogen bromide or chlorine oxygen etchants may be used, but the plasma etchants are not limited to these etchants. For further description on the use of PPMS as a photodefinable oxide, see T. W. Weidman, All Dry Lithography: Applications of Plasma Polymerized Methylsilane as a Single Layer Resist and Silicon Dioxide Precursor, Journal of Photopolymer Science and Technology, Vol. 8, No. 4 (1995).

Figure 6:
FIG. 6 illustrates a cross section of an integrated circuit structure where the PPMSO portion is converted to a silicon dioxide ($SiO_2$) hard mask by plasma ashing and annealing according to one embodiment of the method of the present invention.
Figure 6:
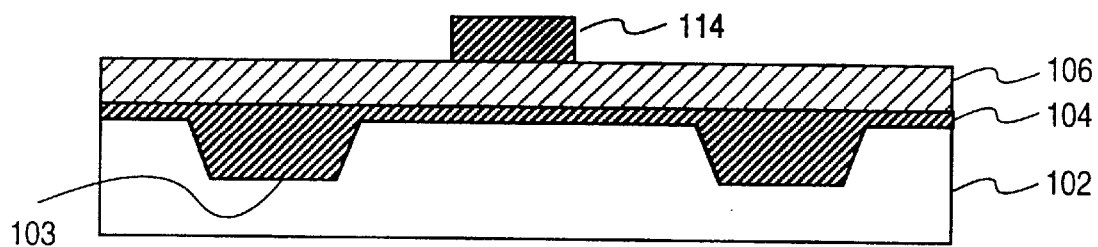

FIG. 6 illustrates a cross section of substrate 102 with PPMSO portion 112 converted to a silicon dioxide hard mask 114 by an oxidation process such as plasma ashing. Hard mask 114 having the pattern of the photoresist mask is thereafter used as a mask in the subsequent process of etching polysilicon layer 106. An annealing step (not shown) then densifies the SiO hard mask and converts it to $SiO_2$ to increase its etch-photoresistant properties as a hard mask. Hard mask 114 may have a thickness in the range of 500–1500 angstroms. This thickness is chosen to be sufficient to withstand process steps involved in the fabrication of polysilicon gate 107 described in connection with FIG. 7.

Figure 7:
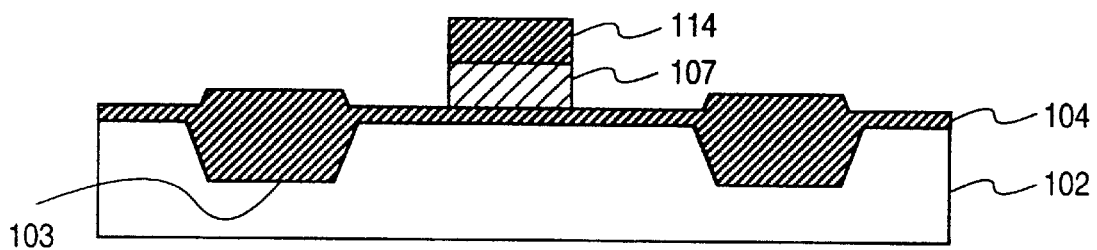
FIG. 7 illustrates a cross section of an integrated circuit structure where the polysilicon layer is patterned and then etched using a hard mask according to one embodiment of the method of the present invention.

FIG. 7 illustrates a cross section through silicon substrate 102 after polysilicon layer 106 (not shown) has been etched according to the pattern defined by hard mask 114. Both hard mask 114 and polysilicon layer 106 are subjected to plasma etching to define polysilicon conducting layer or gate 107. The plasma etch process may be accomplished by using etchants such as hydrogen bromide or chlorine oxygen but the plasma etchants are not limited to these etchants. Hard mask 114 serves as an effective etch photoresistance due to its hardness during the etching process. In this way, the hardness of the hard mask provides effective etch photoresistance while the thinness of this mask allows high image resolution.

Figure 8:
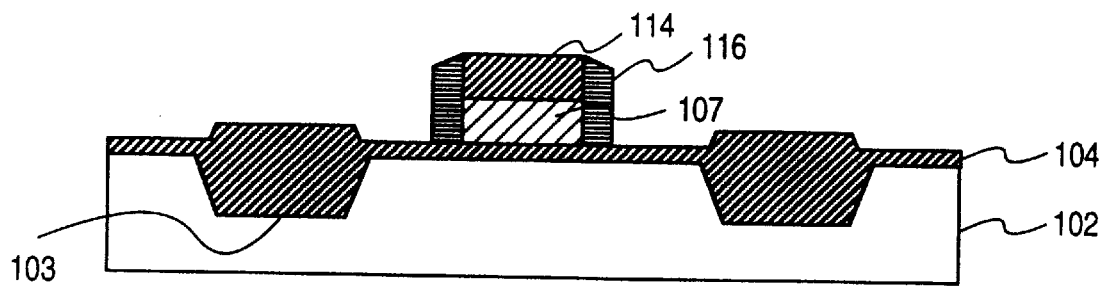
FIG. 8 illustrates a cross section of an integrated circuit structure showing spacers formed on the oxide layer and along the sidewalls of the $SiO_2$ hard mask and polysilicon layer according to one embodiment of the method of the present invention.

FIG. 8 illustrates a cross section through substrate 102 with spacers 116 formed along the sidewalls of $SiO_2$ hard mask 114 and polysilicon gate 107. Spacers 116 may be made of a dielectric material, such as silicon nitride ($Si_3N_4$). Spacers 116 protect gate oxide 104 during the removal of hard mask 114.

Figure 9:
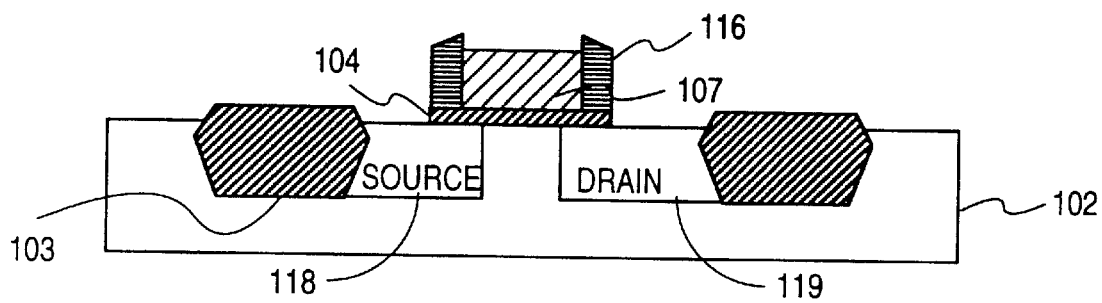
FIG. 9 illustrates a cross section of an integrated circuit structure where the source and drain regions are formed in the substrate and the $SiO_2$ hard mask is removed from both the source and drain regions and the polysilicon gate region according to one embodiment of the method of the present invention.

FIG. 9 illustrates a cross section through a substrate 102 after the etching of $SiO_2$ hard mask 114, with an etchant that removes hard mask 114. Once the gate 107 has been fabricated, active regions 103, source regions 118, and drain regions 119 are formed. Typically, this is done by diffusion or ion implantation, both well known processes in the field.

Figure 10:
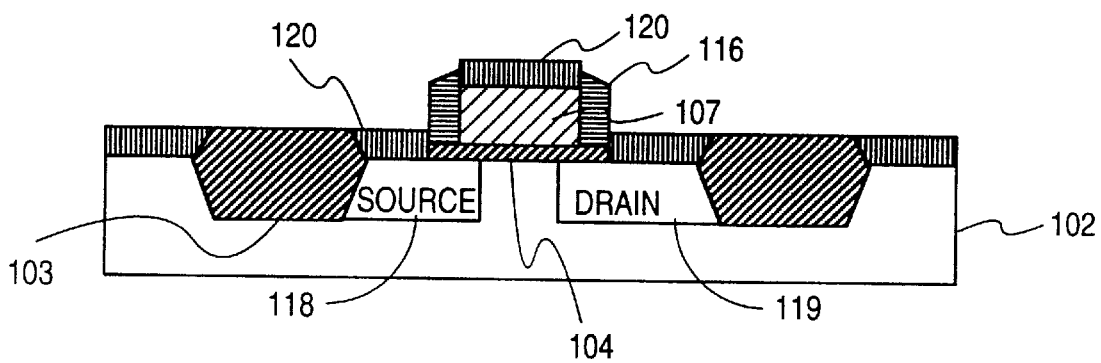
FIG. 10 illustrates a cross section of an integrated circuit structure where silicide is formed on the gate, source, and drain regions according to one embodiment of the method of the present invention.

FIG. 10 illustrates a cross section through substrate 102 where silicide 120 has been formed on the gate, source, and drain regions. Silide material includes but is not limited to, NiSi, PtSi, Tisi and CoSi.

Figure 11:
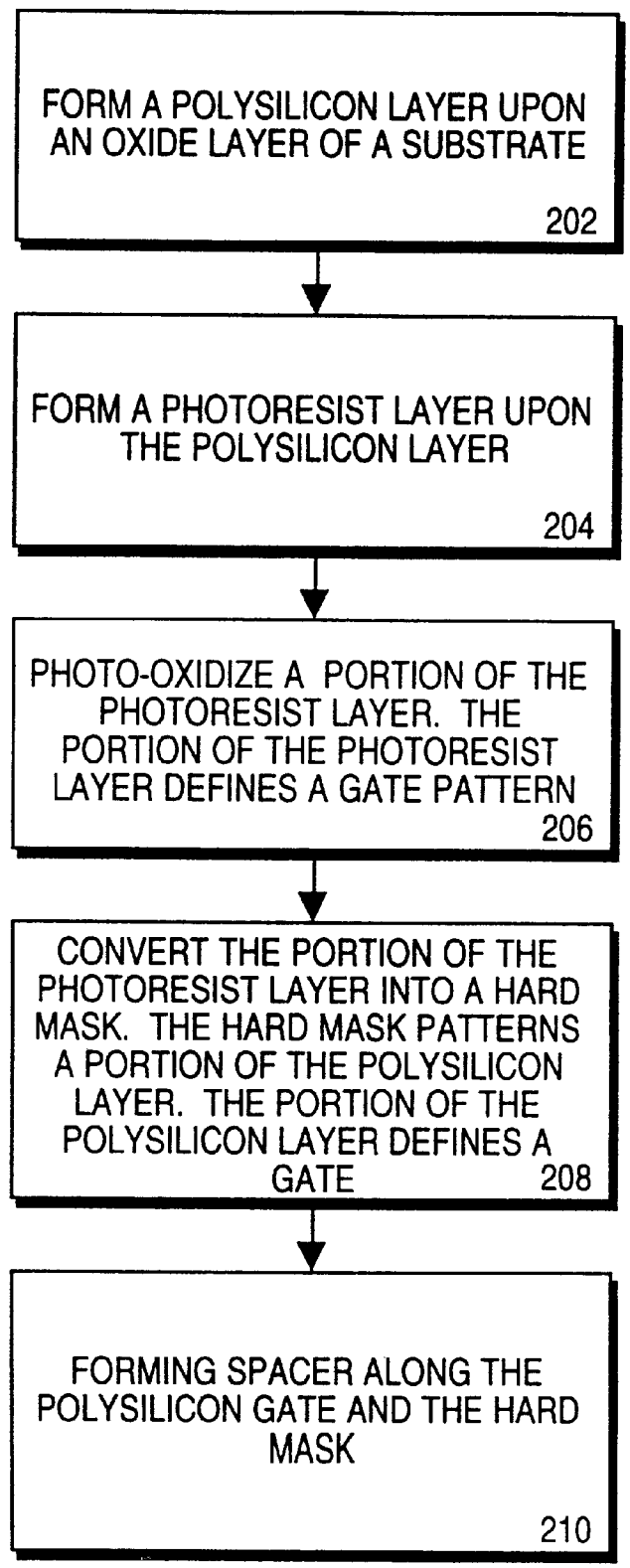
FIG. 11 is a flow chart diagram illustrating the steps of the method according to the present invention.

FIG. 11 illustrates a flow chart diagram in connection with the method according to the present invention. The method starts at step 202 where a polysilicon layer is formed upon an oxide layer of a substrate. At step 204, a photo-photoresist layer is formed upon the polysilicon layer. The method further continues at step 206 where a photoresist portion of the photoresist layer is photo-oxidized. The photoresist portion defines a gate pattern. At step 208, the photoresist portion is converted into a hard mask. The hard mask patterns a portion of the polysilicon layer that defines a gate. At step 210, spacer is formed around the polysilicon gate and the hard mask to protect the gate dielectric during a subsequent hardmask removal step. The source and drain regions are formed and silicide is formed onto the source, drains and gate regions. The method of patterning a gate according to one embodiment of the present invention may be integrated into a standard process flow for making Complementary Metal-Oxide Semiconductor (CMOS) devices.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method for making an integrated circuit device, comprising:

presenting a substrate;

etching trenches in a surface of the substrate;

growing a dielectric layer on a surface of the substrate;

depositing a gate material layer on a surface of the dielectric layer;

forming a patterning layer on a surface of the gate material;

exposing the patterning layer so as to form an oxide layer from the patterning layer having a pattern;

developing the oxide layer to remove that portion external to the pattern of the patterning layer so as to expose a dielectric layer top surface;

forming from the oxide layer a hard mask having sidewalls;

etching the gate material layer according to the pattern defined by the hard mask to form a conducting gate having sidewalls that are complementary to the hard mask side walls;

forming spacers along the dielectric layer top surface and the sidewalls of the conducting gate, wherein the spacers are made from silicon nitride;

removing the hard mask;

forming active regions at each trench by removing material from the gate material layer that is external to each dielectric layer top surface and external to the area underneath each gate; and forming at least one source region and one drain region in the substrate between a gate and two active regions.

2. The method of claim 1, wherein developing the oxide layer includes developing the oxide layer further to form a dielectric layer top surface having elevated surfaces above each trench and wherein forming active regions at each trench include forming active regions at each elevated surface.

3. The method of claim 1, subsequent to forming a hard mask having sidewalls, annealing the hard mask to densify the hard mask into a hard mask having a thinness in the range of 500 angstroms to 1500 angstroms.

4. The method of claim 1, further comprising:

forming spacers along the sidewalls of the hard mask.

5. The method of claim 4, wherein the oxide layer includes plasma polymerized methyl silane, wherein exposing the patterning layer includes exposing the patterning layer to a defined pattern of radiation, wherein removing the hard mask includes removing the hard mask with an etchant, and wherein the uppermost surface of the spacers slopes down towards the dielectric layer top surface from the sidewalls of the hard mask, the method further comprising:

forming a silicide above each gate, source region, and drain region.

6. A Complementary Metal-Oxide Semiconductor device produced by the process of claim 1.

* * * * *

UNITED STATES PATENT AND TRADEMARK OFFICE
CERTIFICATE OF CORRECTION

PATENT NO.     : 6,207,541 B1
DATED          : March 27, 2001
INVENTOR(S)    : Das et al.

Page 1 of 1

It is certified that error appears in the above-identified patent and that said Letters Patent is hereby corrected as shown below:

<u>Column 5,</u>
Line 32, delete "Silide" and replace with -- Silicide --.

Signed and Sealed this

Second Day of April, 2002

Attest:

Attesting Officer

JAMES E. ROGAN
Director of the United States Patent and Trademark Office